United States Patent
Jung et al.

(10) Patent No.: US 12,028,628 B2
(45) Date of Patent: Jul. 2, 2024

(54) IMAGE SENSOR INCLUDING PIXEL INCLUDING INTERNAL CAPACITOR

(71) Applicant: SAMSUNG ELECTRONICS CO., LTD., Suwon-si (KR)

(72) Inventors: Hyunyong Jung, Seoul (KR); Seoksan Kim, Suwon-si (KR); Minwoong Seo, Hwaseong-si (KR); Myunglae Chu, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 17/744,165

(22) Filed: May 13, 2022

(65) Prior Publication Data

US 2022/0394197 A1    Dec. 8, 2022

(30) Foreign Application Priority Data

Jun. 7, 2021 (KR) .................. 10-2021-0073414

(51) Int. Cl.
*H04N 25/59* (2023.01)
*H01L 27/146* (2006.01)
*H04N 25/772* (2023.01)

(52) U.S. Cl.
CPC ....... *H04N 25/59* (2023.01); *H01L 27/14612* (2013.01); *H01L 27/14643* (2013.01); *H04N 25/772* (2023.01)

(58) Field of Classification Search
CPC .... H04N 25/59; H04N 25/772; H04N 25/771; H04N 25/75; H04N 25/766; H01L 27/14612; H01L 27/14643
See application file for complete search history.

(56) References Cited

U.S. PATENT DOCUMENTS

| | | |
|---|---|---|
| 7,277,129 B1 | 10/2007 | Lee |
| 8,605,173 B2 | 12/2013 | Lee et al. |
| 9,313,428 B2 | 4/2016 | Borremans et al. |
| 9,337,223 B2 | 5/2016 | Chieh et al. |
| 10,250,826 B2 | 4/2019 | Mandelli et al. |
| 10,645,314 B2 | 5/2020 | Otaka |
| 10,805,561 B2 | 10/2020 | Sakakibara et al. |
| 10,972,692 B2 | 4/2021 | Seo et al. |

(Continued)

FOREIGN PATENT DOCUMENTS

| | | |
|---|---|---|
| EP | 3681147 A1 | 7/2020 |
| KR | 10-2020-0098802 A | 8/2020 |

OTHER PUBLICATIONS

European Search Report dated Nov. 15, 2022.
European Search Report dated Mar. 2, 2023.
European Search Report dated Feb. 2, 2023.

*Primary Examiner* — Albert H Cutler
(74) *Attorney, Agent, or Firm* — Fish & Richardson P.C.

(57) ABSTRACT

An image sensor includes a pixel having an internal capacitor. Each of a plurality of pixels of the image sensor includes a photodetection circuit and an analog-to-digital converter (ADC). The photodetection circuit generates a detection signal. The ADC converts the detection signal using a ramp signal. The photodetection circuit includes a photodiode, a floating diffusion node and an overflow transistor. The floating diffusion node accumulates photocharges generated by the photodiode and includes a parasitic capacitor. The overflow transistor electrically connects the floating diffusion node to a first internal capacitor of the ADC.

18 Claims, 13 Drawing Sheets

(56) References Cited

U.S. PATENT DOCUMENTS

| | | | |
|---|---|---|---|
| 2009/0086071 A1* | 4/2009 | Kagawa | H04N 25/53 348/300 |
| 2017/0289475 A1* | 10/2017 | Ha | H04N 25/75 |
| 2019/0086071 A1 | 3/2019 | O'Reilly et al. | |
| 2019/0098232 A1* | 3/2019 | Mori | H01L 27/14634 |
| 2019/0356872 A1 | 11/2019 | Manabe et al. | |
| 2020/0195870 A1 | 6/2020 | Shim et al. | |
| 2020/0396401 A1 | 12/2020 | Chu et al. | |
| 2022/0337774 A1* | 10/2022 | Oh | H01L 27/14612 |

* cited by examiner

IMAGE SENSOR INCLUDING PIXEL INCLUDING INTERNAL CAPACITOR

CROSS-REFERENCE TO RELATED APPLICATION

This application is based on and claims priority under 35 U.S.C. § 119 to Korean Patent Application No. 10-2021-0073414, filed on Jun. 7, 2021, in the Korean Intellectual Property Office, the disclosure of which is incorporated by reference herein in its entirety.

BACKGROUND

1. Field

Embodiments relate to an image sensor, and more particularly, to an image sensor including a pixel having an internal capacitor.

2. Description of the Related Art

An image sensor may be a device configured to capture two-dimensional (2D) or three-dimensional (3D) images of an object. The image sensor may generate an image of the object using a photoelectric conversion element configured to respond to the intensity of light reflected from the object. In recent years, with the development of the computer industry and the communication industry, the demand for image sensors with improved performance has increased in various electronic devices, such as digital cameras, camcorders, personal communication systems (PCSs), game consoles, security cameras, medical micro cameras, and mobile phones.

SUMMARY

According to an example embodiment, there is provided an image sensor including a plurality of pixels. Each of the plurality of pixels includes a photodetection circuit and an analog-to-digital converter (ADC). The photodetection circuit generates a detection signal. The ADC converts the detection signal using a ramp signal. The photodetection circuit includes a photodiode, a floating diffusion node and an overflow transistor. The floating diffusion node accumulates photocharges generated by the photodiode and includes a parasitic capacitor. The overflow transistor electrically connects the floating diffusion node to a first internal capacitor of the ADC.

According to another embodiment, there is provided an image sensor configured to operate in each of a plurality of modes according to illuminance. The image sensor includes a pixel array and a pixel driver. The pixel array includes a plurality of pixels, each of which includes a photodetection circuit and an ADC configured to convert a detection signal detected by the photodetection circuit. The pixel driver provides an overflow control signal to the pixel array. Photocharges generated by the photodetection circuit are stored in an internal capacitor included in the ADC in response to the overflow control signal.

According to another embodiment, there is provided an image sensor including a plurality of pixels. Each of the plurality of pixels includes a photodetection circuit and a pixel signal generating circuit. The photodetection circuit generates a detection signal. The pixel signal generating circuit includes a capacitor configured to store charges corresponding to the detection signal. The pixel signal generating circuit generates a pixel signal corresponding to the detection signal. The photodetection circuit includes a photodiode, a floating diffusion node and an overflow transistor. The floating diffusion node accumulates photocharges generated by the photodiode. The overflow transistor electrically connects the floating diffusion node to a capacitor of the pixel signal generating circuit.

According to another embodiment, there is provided an image sensor including a plurality of pixels. Each of the plurality of pixels includes a photodetection circuit and a pixel signal generating circuit. The photodetection circuit detects an optical signal and outputs a detection signal. The pixel signal generating circuit outputs a pixel signal in response to the detection signal. The photodetection circuit includes a photodiode, a floating diffusion node, a reset transistor, a source follower, and an overflow transistor. The photodiode generates photocharges corresponding to the optical signal. The floating diffusion node accumulates the photocharges and has a parasitic capacitor. The reset transistor resets the floating diffusion node. The source follower generates the detection signal corresponding to a voltage of the floating diffusion node. The overflow transistor electrically connects the floating diffusion node to an output node, from which the detection signal is output.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
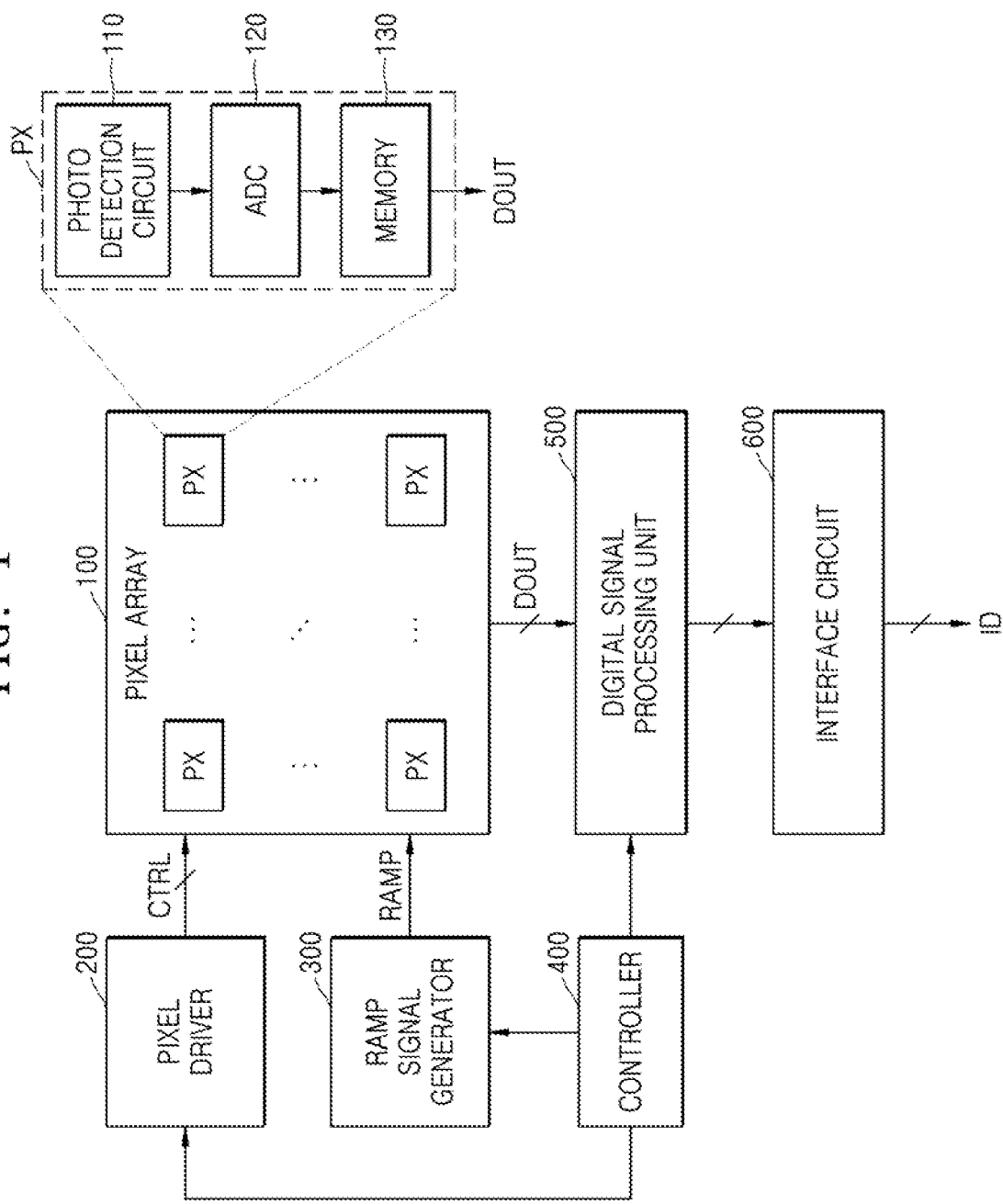
FIG. 1 is a block diagram of an image sensor according to an example embodiment.

FIG. 1 is a block diagram of an image sensor 10 according to an example embodiment.

A pixel PX shown in FIG. 1 may be a digital pixel, which is an example of a pixel including a capacitor.

The image sensor 10 may be mounted in an electronic device having an image sensing function or an optical sensing function. For example, the image sensor 10 may be an electronic device, such as a camera, a smartphone, a wearable device, an Internet of Things (IoT), a tablet personal computer (PC), a personal digital assistant (PDA), a portable multimedia player (PMP), and a navigation device. In addition, the image sensor 10 may be mounted in an electronic device provided as a component in vehicles, pieces of furniture, manufacturing facilities, doors, and various measuring devices.

The image sensor 10 may include a pixel array 100, a pixel driver 200, a ramp signal generator 300, a controller 400, a digital signal processing unit 500, and an interface circuit 600. The pixel array 100 may include a plurality of pixels PX, each of which may sense an external optical signal and output a digital output signal DOUT corresponding to the sensed optical signal.

Each of the plurality of pixels PX may sense the optical signal using a photodetection element and convert the optical signal into the digital output signal DOUT, which is an electric signal. Each of the plurality of pixels PX may sense light having a specific spectral range. For example, the plurality of pixels PX may include a red pixel configured to convert light having a red spectral range into an electric signal, a green pixel configured to convert light having a green spectral range into an electric signal, and a blue pixel configured to convert light having a blue spectral range into an electric signal. A color filter configured to transmit light having a specific spectral range and a microlens configured to condense light may be on each of the plurality of pixels PX.

The pixel PX may include a photodetection circuit 110, an analog-to-digital converter (ADC) 120, and a memory 130.

The photodetection circuit 110 may include a photodetection element, and may convert the optical signal sensed from the outside into an electric signal, that is, a detection signal that is an analog signal. For example, the photodetection element may include a photodiode, a phototransistor, a photogate, or a pinned photodiode. The detection signal may include a detection signal caused by a reset operation on the pixel PX, and may include a detection signal caused by a photodetection operation on the pixel PX.

The ADC 120 may convert the detection signal output by the photodetection circuit 110 into a digital signal, and the memory 130 may store the digital signal therein. The ADC 120 may compare the detection signal with a ramp signal RAMP and convert the detection signal into a digital signal.

The memory 130 may output the digital output signal DOUT via the control of the pixel driver 200.

The image sensor 10 according to the present example embodiment may operate in a plurality of operation modes according to illuminance. In each of the pixels PX, the equivalent capacitance of a floating diffusion node (in which charges corresponding to the optical signal are accumulated) may vary according to an operation mode. For example, in a high-illuminance environment, the image sensor 10 may electrically connect a floating diffusion node of the photodetection circuit 110 to an internal capacitor included in the ADC 120, thereby relatively increasing the equivalent capacitance of the floating diffusion node. As another example, in a low-illuminance environment, the image sensor 10 may electrically isolate the floating diffusion node from the internal capacitor included in the ADC 120, thereby relatively reducing the equivalent capacitance of the floating diffusion node.

The pixel driver 200 may output control signals CTRL for controlling the plurality of pixels PX included in the pixel array 100. In response to the control signals CTRL generated by the pixel driver 200, each of the plurality of pixels PX may generate a detection signal, convert the detection signal into a digital signal using the ramp signal RAMP, store the digital signal, and output the stored digital signal as the digital output signal DOUT. In addition, in response to the control signals CTRL generated by the pixel driver 200, an operation mode of each of the plurality of pixels PX may be changed, and an equivalent capacitance of the floating diffusion node may be changed.

The ramp signal generator 300 may generate the ramp signal RAMP and output the ramp signal RAMP to the pixel array 100. The ramp signal RAMP may be provided to the ADC 120 of the pixel PX and used as a reference signal to be compared with the detection signal. In an example embodiment, the ramp signal RAMP may be a constantly decreasing or increasing signal (i.e., a signal that increases or decreases at a single slope).

The controller 400 may control all operations of the image sensor 10. For example, the controller 400 may control an operating timing of the image sensor 10, based on control information received through the interface circuit 600 from an external device (e.g., an image signal processor (ISP) and an application processor (AP)). The pixel driver 200 and the ramp signal generator 300 may respectively generate the control signal CTRL and the ramp signal RAMP based on timing signals provided by the controller 400.

The digital signal processing unit 500 may perform a digital signal processing operation on the digital output signal DOUT received from the pixel array 100, and may provide final image data ID to the external device. The digital output signal DOUT may include a reset value caused by the reset operation on the pixel PX or an image signal value caused by the photodetection operation on the pixel PX. The digital signal processing unit 500 may perform an operation on the reset value and the image signal value and determine a final digital value corresponding to an optical signal sensed by one pixel PX. By combining the final digital values respectively determined by the plurality of pixels PX, the final image data ID may be generated. Thus, a correlated double sampling (CDS) operation may be implemented using the digital output signal DOUT, which is generated due to the operation of the ADC 120 included in the pixel PX, and using the digital signal processing operation of the digital signal processing unit 500.

The interface circuit 600 may receive control information from the external device, or may output final image data ID to the external device. In an example embodiment, the interface circuit 600 may transmit and receive the above-described pieces of information to and from the external device, based on a predetermined protocol.

Figure 2:
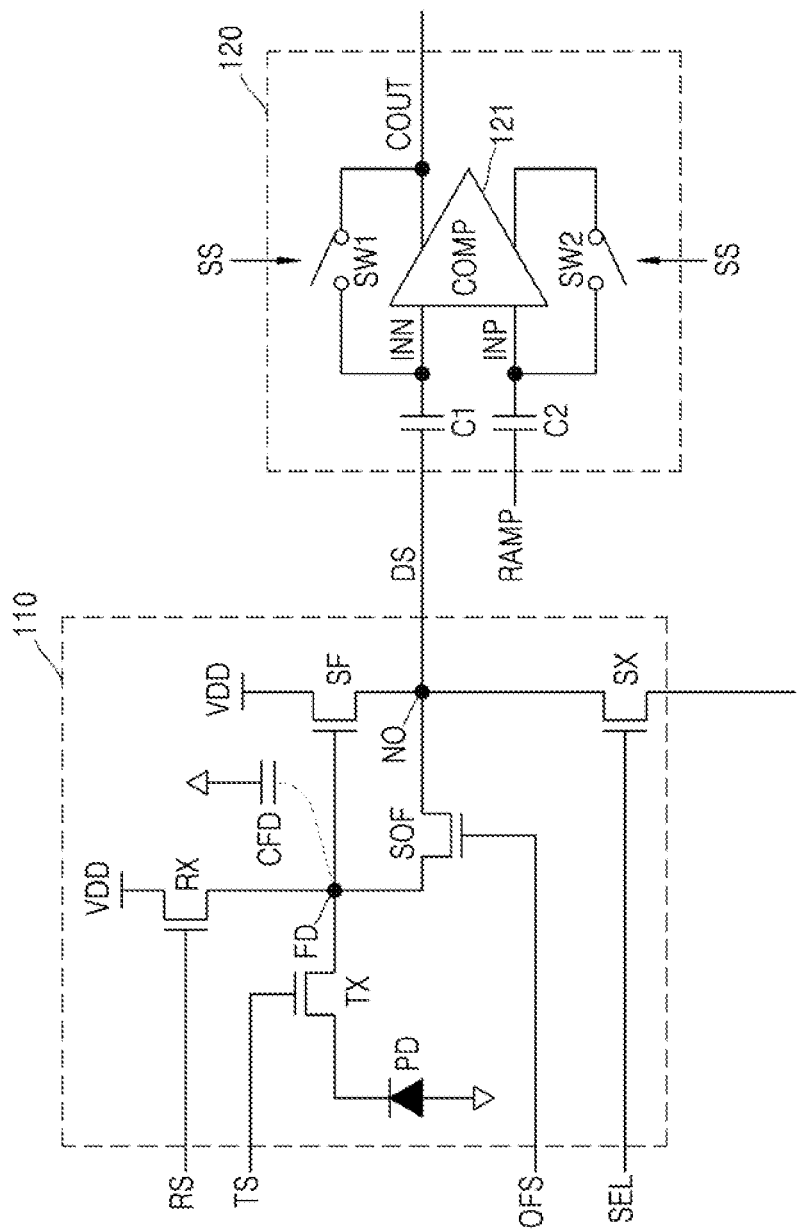
FIG. 2 is a circuit diagram of a portion of a pixel included in an image sensor according to an example embodiment.

FIG. 2 is a circuit diagram of a portion of a pixel PX included in an image sensor, according to an example embodiment.

Hereinafter, a structure and operations of the pixel PX of FIG. 1 will be described based on an example circuit diagram for brevity, but the pixel PX may be variously modified.

A photodetection circuit 110 shown in FIG. 2 may be an example of the photodetection circuit 110 of FIG. 1, and an ADC 120 shown in FIG. 2 may be an example of the ADC 120 of FIG. 1. A reset control signal RS, a transfer control signal TS, a selection control signal SEL, an overflow control signal OFS, and a switching control signal SS, which are described with reference to FIG. 2, may be included in the control signals CTRL of FIG. 1.

Referring to FIG. 2, the photodetection circuit 110 may include a photodiode PD, a transfer transistor TX, a reset transistor RX, a source follower SF, and a selection transistor SX. The photodiode PD may be replaced by another photoelectric conversion element.

The photodiode PD may generate photocharges, which may vary according to the intensity of incident light. The transfer transistor TX may transmit photocharges to a floating diffusion node FD in response to the transfer control signal output by the pixel driver (refer to 200 in FIG. 1).

Photocharges generated by the photodiode PD may be accumulated in the floating diffusion node FD. The floating diffusion node FD may substantially have a parasitic capacitor CFD, and the photocharges may be accumulated in the parasitic capacitor CFD. The reset transistor RX may reset the floating diffusion node FD to a level of a power supply voltage VDD in response to the reset control signal RS provided by the pixel driver 200.

The source follower SF may transmit a detection signal DS to an output node NO depending on potentials corresponding to the photocharges accumulated in the floating diffusion node FD. The source follower SF may be connected to the output node NO, and may provide a current path through which current of the source follower SF flows, in response to the selection control signal SEL output by the pixel driver 200.

FIG. 2 illustrates an example in which the photodetection circuit 110 of the pixel PX includes one photodiode PD and has a 4-transistor (4T) structure including the transfer transistor TX, the reset transistor RX, the source follower SF, and the selection transistor SX, but in other implementations one or more of the transfer transistor TX, the reset transistor RX, the source follower SF, and the selection transistor SX may be omitted.

The pixel PX according to the present example embodiment may include an overflow transistor SOF. The overflow transistor SOF may be connected between the floating diffusion node FD and the output node NO. The overflow transistor SOF may electrically connect the floating diffusion node FD to the output node NO, or electrically isolate the floating diffusion node FD from the output node NO, in response to the overflow control signal OFS output by the pixel driver 200.

The ADC 120 may be, for example, a single-slope ADC. The ADC 120 may include a comparator 121, a first switch SW1, a second switch SW2, a first capacitor C1, and a second capacitor C2.

The comparator 121 may include a differential amplifier. The detection signal DS may be applied as a first input signal INN to a first input terminal of the comparator 121 through the first capacitor C1, and the ramp signal RAMP may be applied as a second input signal INP to a second input terminal of the comparator 121 through the second capacitor C2. The comparator 121 may receive the detection signal DS and the ramp signal RAMP from the first and second capacitors C1 and C2, compare the detection signal DS with the ramp signal RAMP, and output a comparison result signal COUT.

The first capacitor C1, which has a relatively large capacitance, may be connected to the output node NO of the photodetection circuit 110. When the overflow transistor SOF is turned on, the floating diffusion node FD may be connected to the output node NO, and thus, the parasitic capacitor CFD of the floating diffusion node FD may be electrically connected to the first capacitor C1 of the ADC 120. Accordingly, when the overflow transistor SOF is turned on, the equivalent capacitance of the floating diffusion node FD may increase, and a relatively large amount of photocharges generated by the photodiode PD may be accumulated in the parasitic capacitor CFD of the floating diffusion node FD and the first capacitor C1 of the ADC 120. Thus, the full well capacity (FWC) of the pixel PX may increase. Therefore, the image sensor according to the present example embodiment may increase the equivalent capacitance of the floating diffusion node FD in a high-illuminance environment by turning the overflow transistor SOF on. Thus, a high dynamic range (HDR) may be obtained without increasing the area of the pixel PX. In addition, by reducing the equivalent capacitance of the floating diffusion node FD in a low-illuminance environment, a high conversion gain may be obtained. Thus, a wide dynamic range (WDR) may be obtained.

The first switch SW1 and the second switch SW2 may be turned on in response to the switching control signal SS. When the first switch SW1 and the second switch SW2 are turned on in response to the switching control signal SS, an input terminal and an output terminal of the comparator 121 may be connected to each other, and the comparator 121 may be reset. For example, the comparator 121 may be reset in response to the switching control signal SS in an auto-zero period, before the comparator 121 performs the comparison operation.

Figure 3:
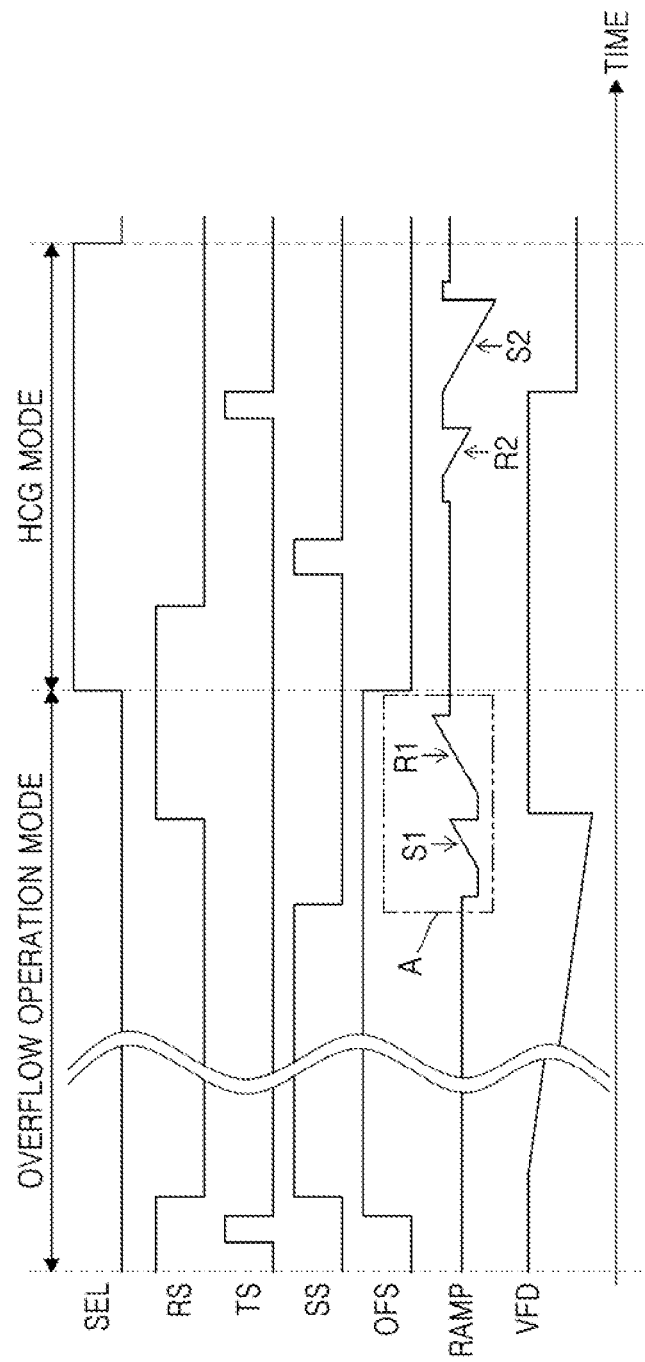
FIG. 3 is a timing diagram of control signals and a ramp signal, which are provided to a pixel included in an image sensor, according to an example embodiment.
Figure 4:
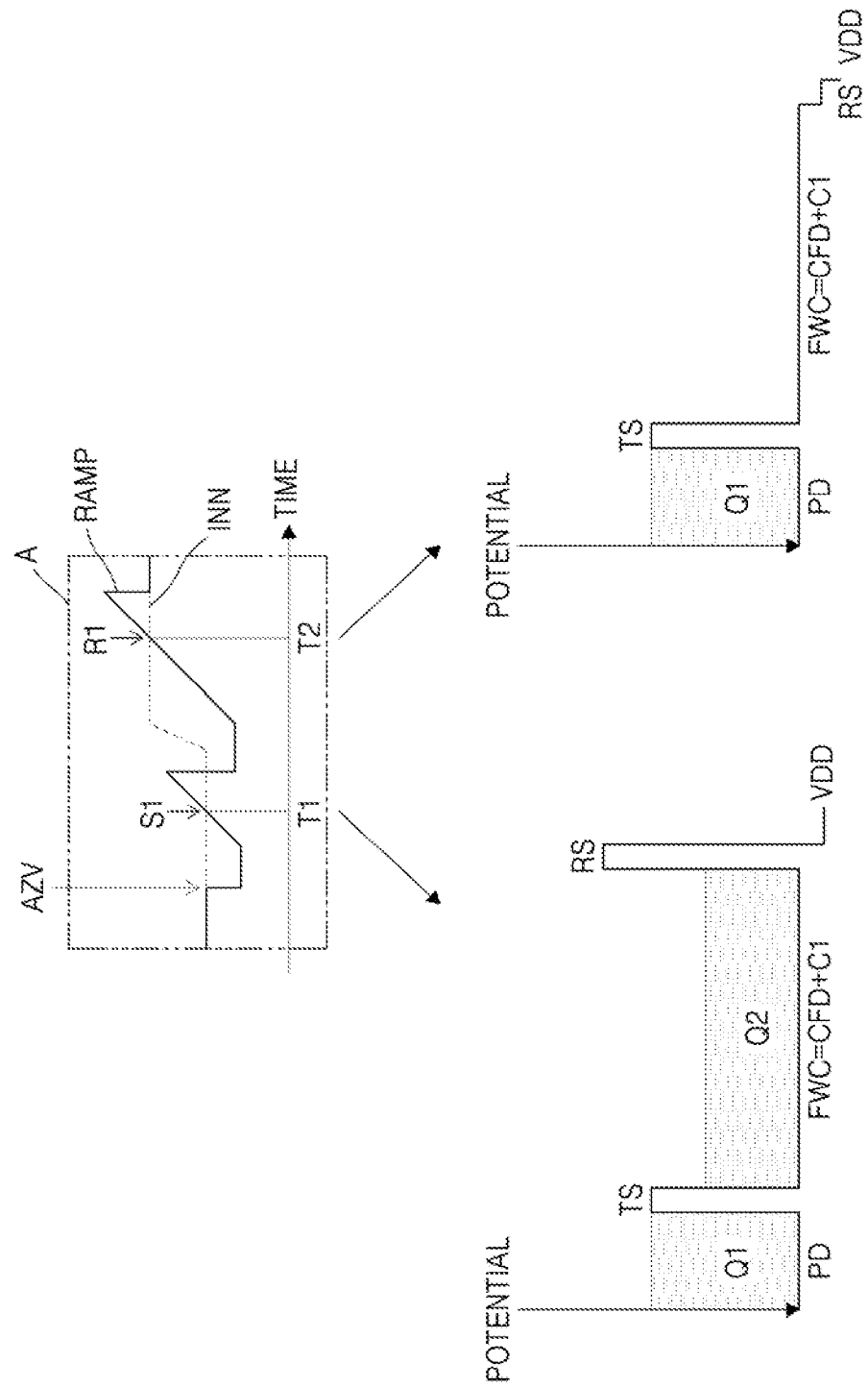
FIG. 4 is a diagram of a potential level of a pixel in a sampling period during an overflow operation.

FIG. 3 is a timing diagram of control signals and a ramp signal, which are provided to a pixel included in an image sensor, according to an example embodiment. FIG. 4 is a diagram of a potential level of a pixel in a sampling period A during an overflow operation.

Referring to FIGS. 2 and 3, the pixel PX may operate in a plurality of operation modes according to illuminance. For example, in a high-illuminance operation mode, the pixel PX may operate in an overflow operation mode and a high conversion gain (HCG) mode. In contrast, in a low-illuminance operation mode, the pixel PX may operate only in the HCG mode.

The overflow operation mode may refer to an operation mode for sensing photocharges, which are generated and overflowed by the photodiode PD. The overflow operation mode may include operations described below. In the overflow operation mode, the selection control signal SEL may be maintained at a low level, and the selection transistor SX may be maintained in an off state. When the overflow operation mode starts, the reset control signal RS and the transfer control signal TS may be elevated to a high level at the same time, and thus, the photodiode PD and a floating diffusion node FD may be reset together.

When the transfer control signal TS is changed from a high level to a low level, the overflow control signal OFS may be changed from a low level to a high level. In response to the overflow control signal OFS, the overflow transistor SOF may be in an on state, and the floating diffusion node FD may be connected to the output node NO. The FWC of the pixel PX may be the sum of the capacitance of a capacitor CFD of the floating diffusion node FD and the capacitance of the first capacitor C1 of the ADC 120. Thus, charges overflowed by the photodiode PD may not be drained but may be accumulated in the pixel PX with an extended FWC. When the FWC of the pixel PX is increased, the time taken to accumulate the charges may increase.

The switching control signal SS may be changed from a low level to a high level and maintained at high level before a comparison operation is performed by the comparator 121 (i.e., before a sampling operation). Accordingly, an input terminal (to which a first input signal INN of the comparator 121 is applied) may be connected to an output terminal (from which the comparison result signal COUT is output) and, thus, a voltage of the input terminal may be stabilized.

A voltage VFD of the floating diffusion node FD may be gradually reduced when charges accumulated in the photodiode PD begin to overflow after the reset control signal RS is changed from a high level to a low level to complete a reset operation on the floating diffusion node FD. As the overflowed photocharges are accumulated in the floating diffusion node FD and the first capacitor C1 of the ADC 120, the voltage VFD of the floating diffusion node FD may be gradually reduced.

Referring to FIGS. 2 to 4, to perform a sampling operation in the sampling period A, the switching control signal SS may be changed from a high level to a low level. In this case, a voltage of the first input signal INN in a state in which the comparator 121 is reset may be referred to as an auto-zero voltage AZV.

Due to the overflowed charges in the photodiode PD, charges may be stored in the floating diffusion node FD and the first capacitor C1, and a first input signal INN corresponding to a charged amount Q2 may be sampled as a first image signal S1.

To convert the first image signal S1, which is an analog signal, into a digital signal, the ramp signal RAMP may gradually increase after an offset is applied in the sampling period A. When a voltage level of the first image signal S1 becomes lower than that of the ramp signal RAMP, the polarity of the comparison result signal COUT of the comparator 121 may be changed. The first image signal S1 may be converted into a digital signal based on a time point T1 at which the polarity of the comparison result signal COUT is changed.

When the conversion of the first image signal S1 into the digital signal is completed, the reset control signal RS may be changed from a low level to a high level, charges stored in the floating diffusion node FD and the first capacitor C1 may be drained, the voltage VFD of the floating diffusion node FD may be reset to a power supply voltage VDD. Due to a change in the voltage VFD of the floating diffusion node FD, a voltage level of the first input signal INN may increase, and the first input signal INN may be sampled as a first reset signal R1.

To convert the first reset signal R1, which is an analog signal, into a digital signal, the ramp signal RAMP may gradually increase after an offset is applied. When a voltage level of the first reset signal R1 becomes lower than that of the ramp signal RAMP, the polarity of the comparison result signal COUT of the comparator 121 may be changed. The first reset signal R1 may be converted into the digital signal based on a point in time T2 at which the polarity of the comparison result signal COUT is changed.

Referring back to FIGS. 2 and 3, the HCG mode may refer to a mode for sensing photocharges that are generated by the photodiode PD but not overflowed. The HCG mode may include operations described below. In the HCG mode, the overflow control signal OFS may be maintained at a low level, the overflow transistor SOF may be maintained in an off state, and the floating diffusion node FD may be electrically isolated from the output node NO of the photodetection circuit 110. In addition, in the HCG mode, the selection control signal SEL may be maintained at a high level, and the selection transistor SX may be maintained in an on state.

When the HCG mode starts, the reset control signal RS may be at a high level, and the floating diffusion node FD may be reset. Thus, the voltage VFD of the floating diffusion node FD may be reset to the power supply voltage VDD. When the reset control signal RS is changed from a high level to a low level and the reset operation on the floating diffusion node FD is completed, the switching control signal SS may be changed from a low level to a high level, and the comparator 121 may be reset.

When the switching control signal SS is changed again from the high level to the low level, an operation of comparing a first input signal INN with the ramp signal RAMP may be performed. The first input signal INN may be sampled as a second reset signal R2.

To convert the second reset signal R2, which is an analog signal, into a digital signal, the ramp signal RAMP may be gradually reduced after an offset is applied. When a voltage level of the second reset signal R2 becomes higher than that of the ramp signal RAMP, the polarity of the comparison result signal COUT of the comparator 121 may be changed. The second reset signal R2 may be converted into a digital signal based on a point in time at which the polarity of the comparison result signal COUT is changed.

When the conversion of the second reset signal R2 into a digital signal is completed, the transfer control signal TS may be changed from a low level to a high level, and charges accumulated in the photodiode PD may be accumulated in the floating diffusion node FD. The voltage VFD of the floating diffusion node FD may be reduced based on an amount (e.g., Q1 in FIG. 4) of charge accumulated in the photodiode PD. A first input signal INN corresponding to the amount Q1 of charge may be sampled as a second image signal S2.

To convert the second image signal S2, which is an analog signal, into a digital signal, the ramp signal RAMP may be gradually reduced after an offset is applied. When a voltage level of the second image signal S2 becomes higher than that of the ramp signal RAMP, the polarity of the comparison result signal COUT of the comparator 121 may be changed. The second image signal S2 may be converted into a digital signal based on a point in time at which the polarity of the comparison result signal COUT is changed.

In the high-illuminance mode, the image sensor according to the present example embodiment may perform the overflow operation mode and the HCG mode. Thus, light having high illuminance may be detected without discarding the overflowed charges. In the HCG mode, the equivalent capacitance of the floating diffusion node FD may be reduced to be lower than in the overflow operation mode. Thus, a potential change of the floating diffusion node FD may increase, and a conversion gain may be increased. In contrast, in the low-illuminance mode, the image sensor may perform the HCG mode, and thus, a conversion gain may be increased.

Figure 5:
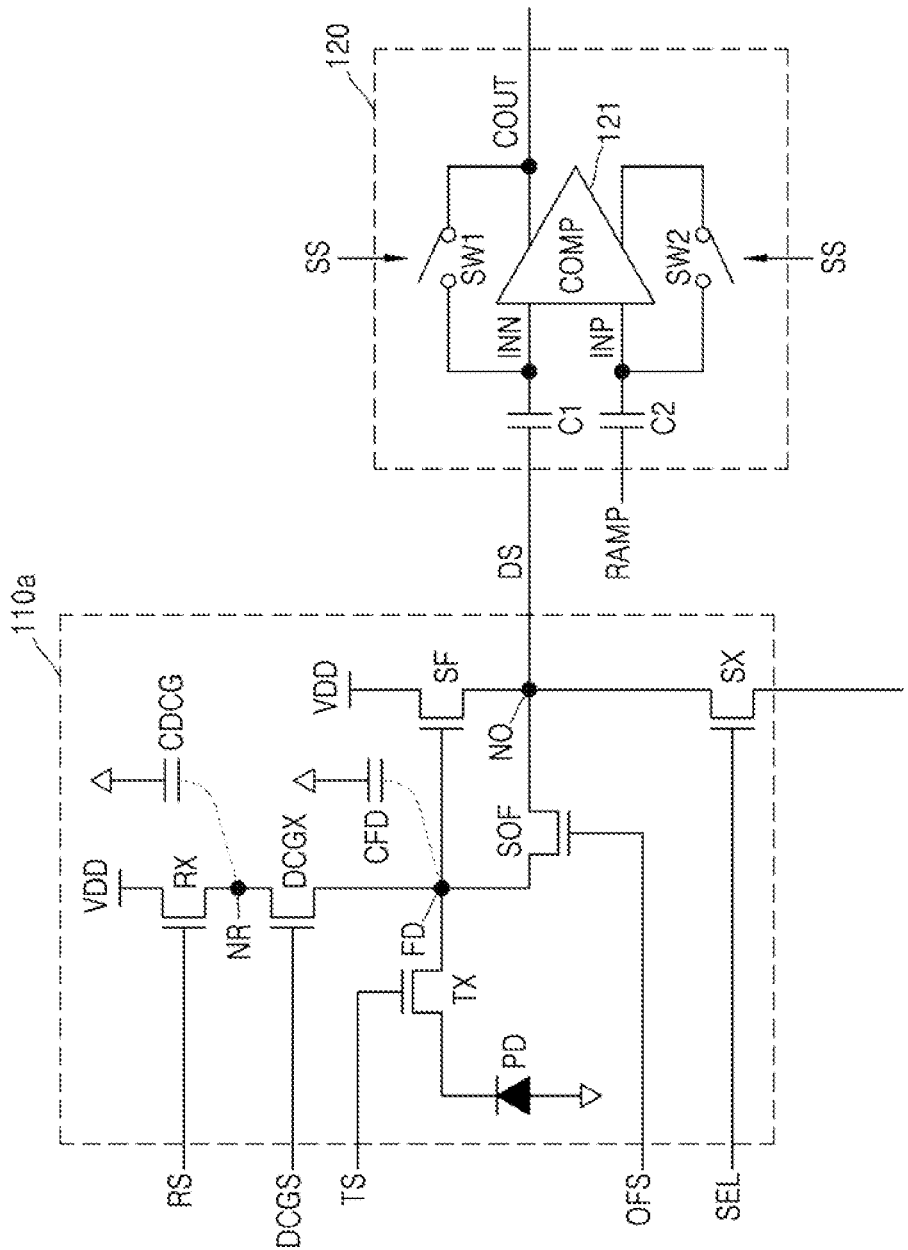
FIG. 5 is a circuit diagram of a portion of a pixel included in an image sensor according to an example embodiment.

FIG. 5 is a circuit diagram of a portion of a pixel included in an image sensor, according to an example embodiment.

A photodetection circuit 110a shown in FIG. 5 may be an example of the photodetection circuit 110. In FIG. 5, the same descriptions as those given with reference to FIG. 2 may be omitted.

Referring to FIG. 5, the photodetection circuit 110a may include a photodiode PD, a transfer transistor TX, a reset transistor RX, a source follower SF, a selection transistor SX, an overflow transistor SOF, and a conversion gain transistor DCGX. Control signals RS, DCGS, TS, OFS, and SEL provided to the photodetection circuit 110a may be some of the control signals CTRL generated by the pixel driver (refer to 200 in FIG. 1).

On/off operations of the conversion gain transistor DCGX may be controlled in response to the conversion gain control signal DCGS.

A pixel voltage VPIX may be applied to a first terminal of the reset transistor RX, and a second terminal may be connected to a reset node NR. A first terminal of the conversion gain transistor DCGX may be connected to the reset node NR, and a second terminal of the conversion gain transistor DCGX may be connected to the floating diffusion node FD.

The reset node NR may substantially have a parasitic capacitor CDCG, and photocharges may be accumulated in the parasitic capacitor CDCG. In an example embodiment, the image sensor may operate in a low conversion gain (LCG) mode and an HCG mode, and may support a dual conversion gain (DCG) function.

In the LCG mode, when the transfer control signal TS is maintained at a high level to accumulate photocharges generated by the photodiode PD in the floating diffusion node FD, the conversion gain control signal DCGS may be at a high level. During the accumulation of photocharges in a capacitor CFD of the floating diffusion node FD, the conversion gain transistor DCGX may be turned on, and photocharges may also be accumulated in the capacitor CDCG of the conversion gain transistor DCGX. Accordingly, an effect of substantially increasing the equivalent capacitance of the floating diffusion node FD may be obtained, and conversion efficiency (or conversion gain) may be reduced.

In the HCG mode, when the transfer control signal TS is maintained at a high level, the conversion gain control signal DCGS may be maintained at a low level. Although the equivalent capacitance of the floating diffusion node FD may be relatively reduced, conversion efficiency may increase. Accordingly, the image sensor may perform all of an overflow mode, the LCG mode, and the HCG mode within one frame, and a dynamic range may be extended.

As described above, in the present example embodiment, an additional capacitor may be further connected to the reset node NR. When the conversion gain transistor DCGX is turned on, the additional capacitor may be electrically connected to the floating diffusion node FD, and thus, the equivalent capacitance of the floating diffusion node FD may further increase.

Figure 6:
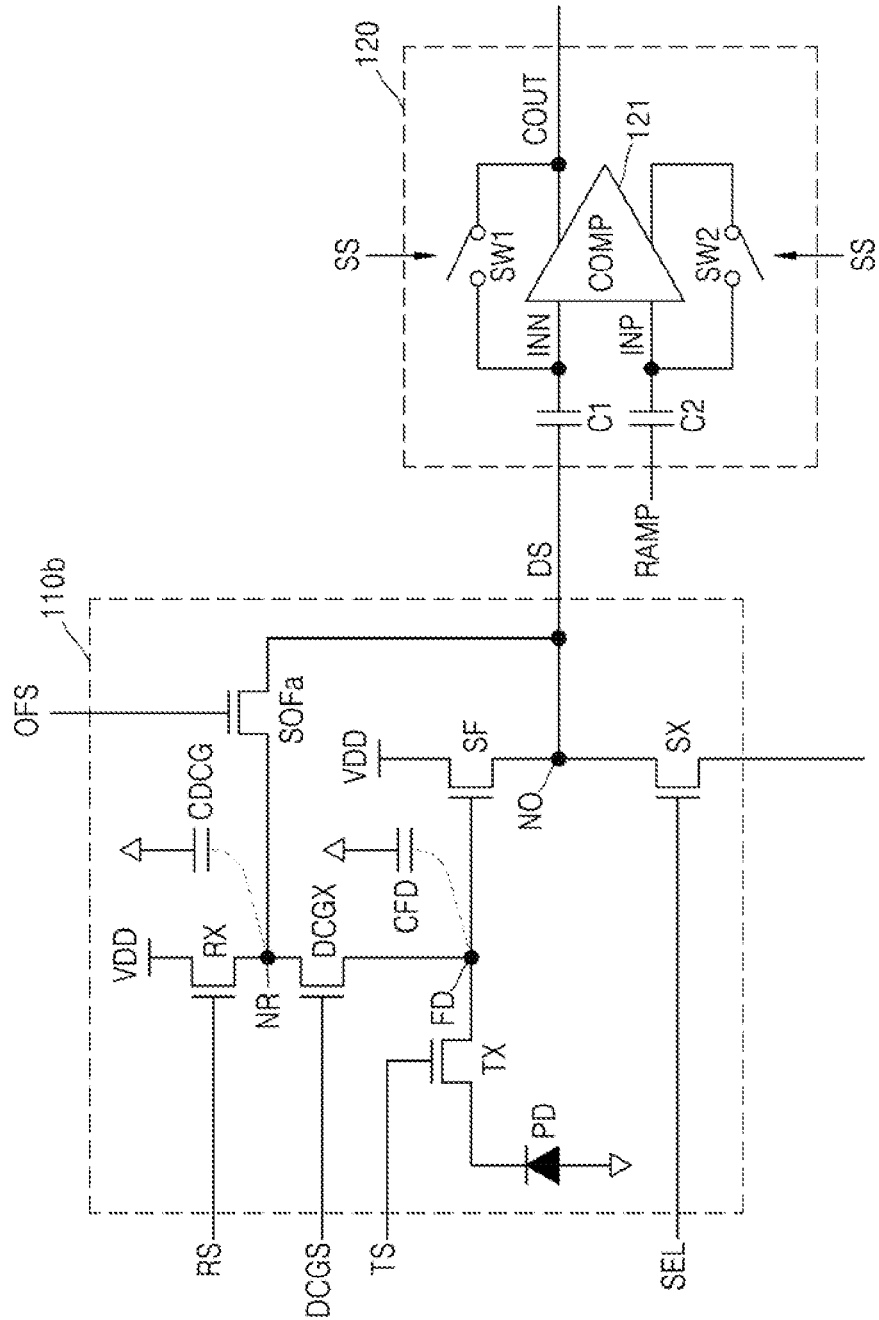
FIG. 6 is a circuit diagram of a portion of a pixel included in an image sensor according to an example embodiment.

FIG. 6 is a circuit diagram of a portion of a pixel included in an image sensor, according to an example embodiment.

A photodetection circuit 110b shown in FIG. 6 may be an example of the photodetection circuit 110 of FIG. 1. In FIG. 6, the same descriptions as those given with reference to FIGS. 2 and 5 may be omitted.

Referring to FIG. 6, the photodetection circuit 110b may include a photodiode PD, a transfer transistor TX, a reset transistor RX, a source follower SF, a selection transistor SX, and a conversion gain transistor DCGX. Control signals RS, DCGS, TS, OFS, and SEL provided to the photodetection circuit 110b may be some of the control signals CTRL generated by the pixel driver (refer to 200 in FIG. 1).

The photodetection circuit 110b may further include an overflow transistor SOFa. The overflow transistor SOFa may be connected between the floating diffusion node FD and a reset node NR. The overflow transistor SOFa may electrically connect the floating diffusion node FD to the reset node NR, or electrically isolate the floating diffusion node FD from the reset node NR, in response to the overflow control signal OFS output by the pixel driver (refer to 200 in FIG. 1).

In an overflow operation mode, by turning on the overflow transistor SOFa and the conversion gain transistor DCGX at the same time, the image sensor according to the present example embodiment may control pixels such that photocharges generated and overflowed by the photodiode PD are accumulated in a capacitor CFD of the floating diffusion node FD, a capacitor CDCG of the conversion gain transistor DCGX, and the first capacitor C1 of the ADC 120.

In an LCG mode, by turning off the overflow transistor SOFa and turning on the conversion gain transistor DCGX, the image sensor may control the pixels such that photocharges generated and overflowed by the photodiode PD are accumulated in the capacitor CFD of the floating diffusion node FD and the capacitor CDCG of the conversion gain transistor DCGX.

In an HCG mode, by turning off both the overflow transistor SOFa and the conversion gain transistor DCGX, the image sensor may control the pixels such that photocharges generated and overflowed by the photodiode PD are accumulated only in the capacitor CFD of the floating diffusion node FD.

Figure 7:
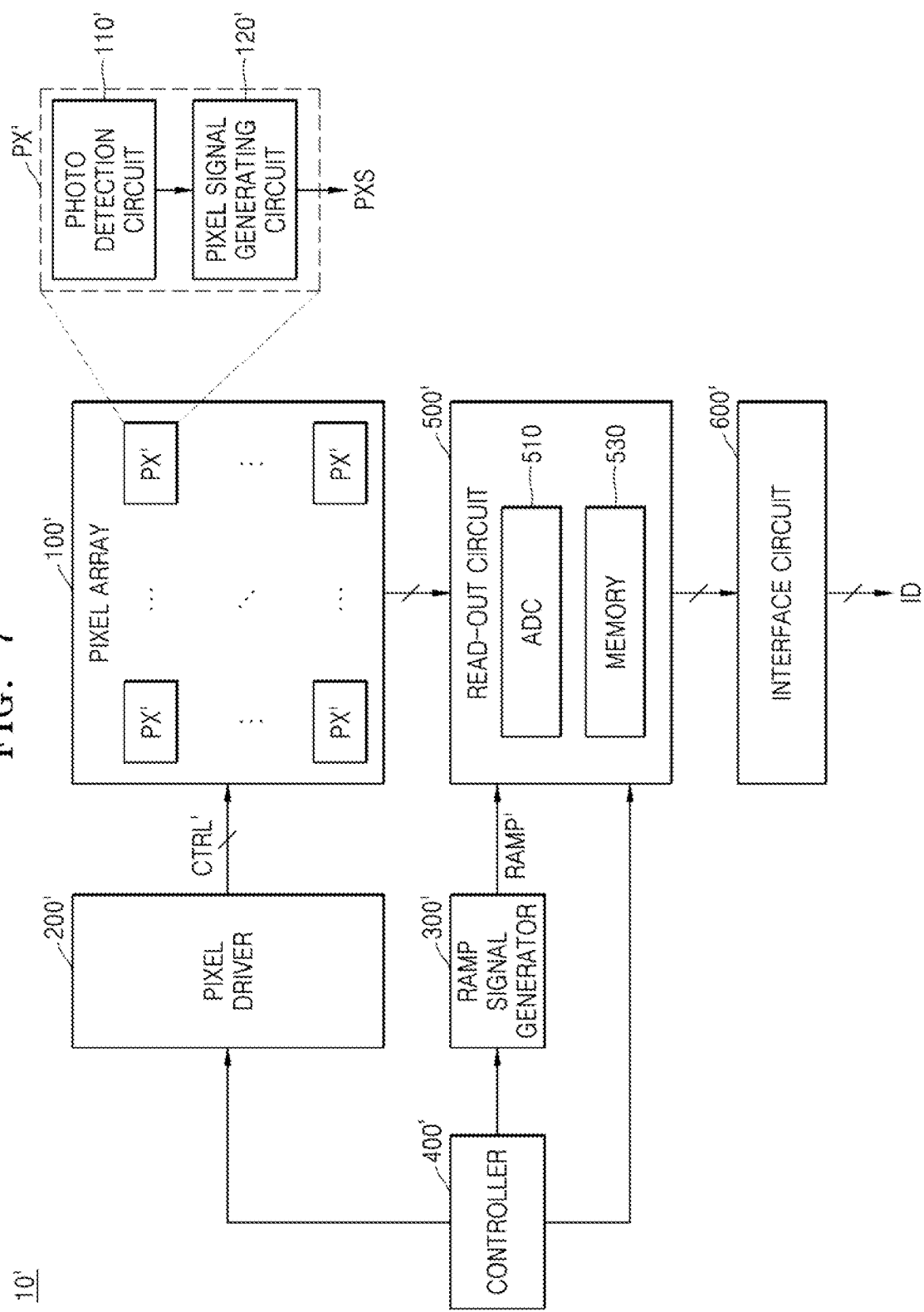
FIG. 7 is a block diagram of an image sensor according to an example embodiment.

FIG. 7 is a block diagram of an image sensor 10' according to an example embodiment.

A pixel PX' shown in FIG. 7, which is an example of a pixel including a capacitor, may be a pixel capable of a global shutter operation. As compared with the image sensor 10 of FIG. 1, the image sensor 10' of FIG. 7 may include an ADC 510, which may not be included in each of pixels PX' but may be provided outside a pixel array 100'. In FIG. 7, descriptions of the same elements as with reference FIG. 1 may be omitted.

Referring to FIG. 7, the image sensor 10' may include a pixel array 100', a pixel driver 200', a ramp signal generator 300', a controller 400', a readout circuit 500', and an interface circuit 600'.

The pixel array 100' may include the plurality of pixels PX', each of which may sense an external optical signal and output a pixel signal PXS corresponding to the sensed optical signal.

In the pixel array 100', the plurality of pixels PX' may be arranged in a matrix form in a plurality of rows and a plurality of columns. In a global shutter mode, the image sensor 10' may control points in time at which photocharges are accumulated in the pixels PX' arranged in different rows to be the same, and image distortion caused by a difference in photocharge accumulation time may be eliminated.

The pixel PX' may include a photodetection circuit 110' and a pixel signal generating circuit 120'.

The photodetection circuit 110' may include a photodetection element, and may convert an optical signal sensed from the outside into an electric signal, that is, a detection signal that is an analog signal. The detection signal may include a detection signal caused by a reset operation on the photodetection circuit 110', and may include a detection signal caused by a photodetection operation on the photodetection circuit 110'.

The pixel signal generating circuit 120' may receive the detection signal, generate a pixel signal PXS corresponding to the detection signal, and output the pixel signal PXS through a column line. The pixel signal generating circuit 120' may include an internal capacitor, and may store an amount of charge corresponding to the detection signal in the internal capacitor. For instance, the pixel signal generating circuit 120' may include a first capacitor in which charges corresponding to the photodetection operation are accumulated, and a second capacitor in which charges corresponding to a reset operation are accumulated. Because the pixel PX' includes the first capacitor and the second capacitor, points in time at which photocharges are accumulated in the pixels PX' arranged in different rows may be controlled to be the same.

The image sensor 10' according to the present example embodiment may operate in a plurality of operation modes according to illuminance. In each of the pixels PX', the equivalent capacitance of a floating diffusion node (in which charges corresponding to the optical signal are accumulated) may vary according to an operation mode.

For example, in a high-illuminance environment, the image sensor 10' may electrically connect the floating diffusion node of the photodetection circuit 110' to the internal capacitor included in the pixel signal generating circuit 120' and relatively increase the equivalent capacitance of the floating diffusion node.

As another example, in a low-illuminance environment, the image sensor 10' may electrically isolate the floating diffusion node from the internal capacitor included in the pixel signal generating circuit 120'. Thus, the equivalent capacitance of the floating diffusion node may be relatively reduced.

The pixel driver 200' may output control signals CTRL' for controlling the plurality of pixels PX' included in the pixel array 100'. In response to the control signal CTRL' generated by the pixel driver 200', each of the plurality of pixels PX' may operate in a plurality of operation modes according to illuminance. In an example embodiment, to operate in the global shutter mode, the pixel driver 200' may determine points in time at which the control signal CTRL' to be output to each of the plurality of pixels PX' is activated and deactivated.

The ramp signal generator 300' may generate the ramp signal RAMP' and provide the ramp signal RAMP' to the readout circuit 500' (e.g., the ADC 510). The ramp signal RAMP' may be a signal for converting an analog signal into a digital signal, and may be generated as a triangular wave signal.

The readout circuit 500' may include an ADC 510 and a memory 520.

The ADC 510 may sample and hold a pixel signal PXS provided by the pixel array 100', and perform a CDS operation for doubly sampling a reset signal and an image signal to output a level corresponding to a difference between the reset signal and the image signal. The ADC 510 may receive a ramp signal RAMP', compare the ramp signal RAMP' with each of the reset signal and an image signal, and output a comparison result signal. The ADC 510 may convert the comparison result signal into a digital signal.

The memory 520 may latch the digital signal, and sequentially output pieces of the latched image data ID.

Figure 8:
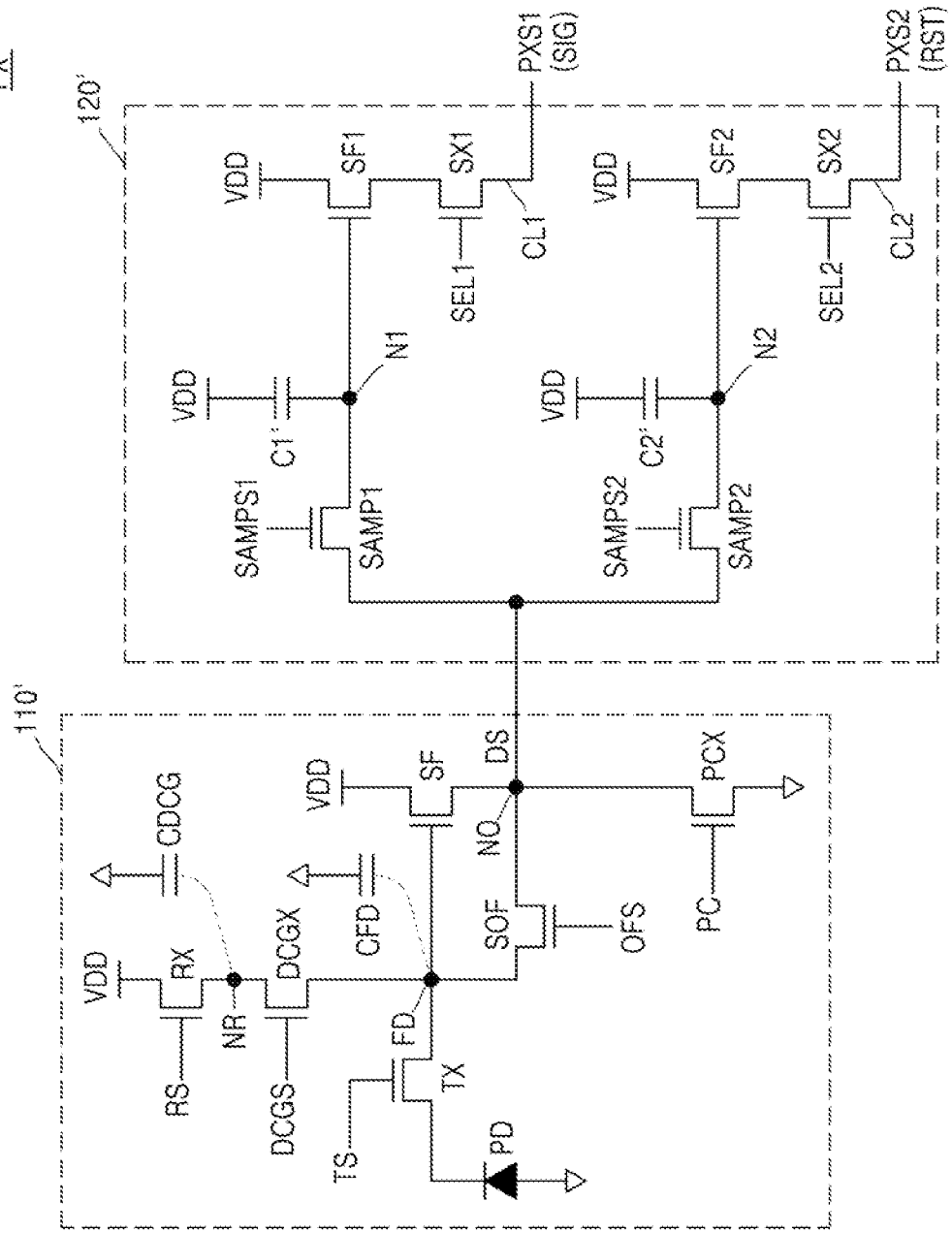
FIGS. 8 and 9 are circuit diagrams of pixels included in image sensors, according to example embodiments.
Figure 9:
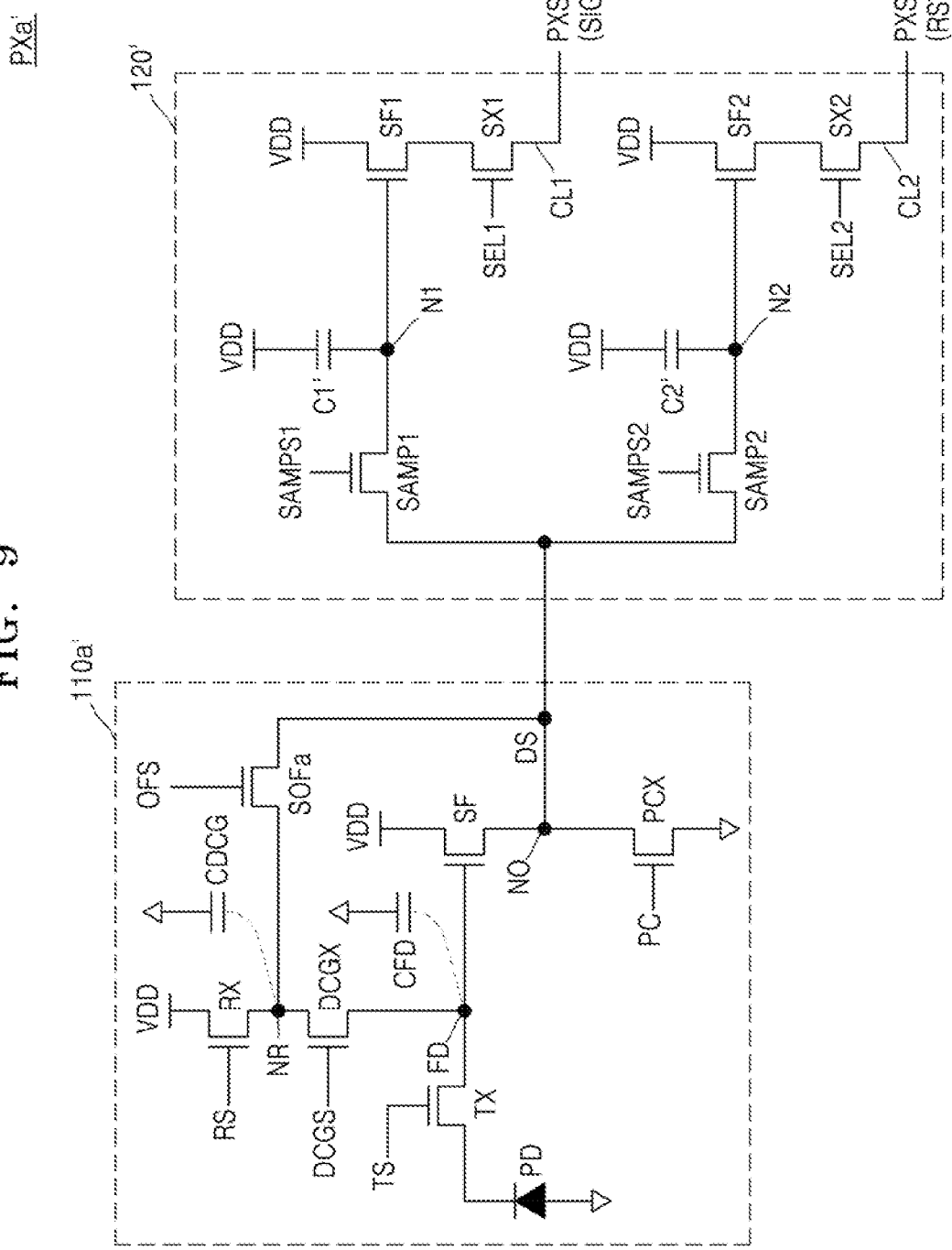

FIGS. 8 and 9 are circuit diagrams of pixels included in image sensors, according to example embodiments.

Pixels PX' and PXa' respectively shown in FIGS. 8 and 9 may be examples of pixels capable of a global shutter operation. In the image sensor according to the present example embodiment, a circuit configuration of a pixel signal generating circuit 120' included in each of the pixels PX' and PXa' may be variously modified.

A reset control signal RS, a conversion gain control signal DCGS, a transfer control signal TS, an overflow control signal OFS, a precharge control signal PC, first and second sampling control signals SAMPS1 and SAMPS2, and first and second selection control signals SEL1 and SEL2, which are described with reference to FIGS. 8 and 9, may be included in the control signals CTRL' of FIG. 7. In FIGS. 8 and 9, the same descriptions as those given with reference to FIGS. 2, 5, and 6 may be omitted.

Referring to FIG. 8, the pixel PX' may include a photodetection circuit 110', and a pixel signal generating circuit 120' configured to output a first pixel signal PXS1 and a second pixel signal PXS2 in response to a detection signal DS output by the photodetection circuit 110'. The photodetection circuit 110' may output the detection signal DS corresponding to an optical signal.

The photodetection circuit 110' may include a photodiode PD, a transfer transistor TX, a reset transistor RX, a source follower SF, a precharge transistor PCX, an overflow transistor SOF, and a conversion gain transistor DCGX. However, unlike as shown in FIG. 8, the photodetection circuit 110' may not include the conversion gain transistor DCGX.

The overflow transistor SOF may be connected between a floating diffusion node FD and an output node NO. The overflow transistor SOF may electrically connect the floating diffusion node FD to the output node NO, or electrically isolate the floating diffusion node FD from the output node NO, in response to the overflow control signal OFS output by a pixel driver 200.

A first terminal of the precharge transistor PCX may be connected to the output node NO, and a ground voltage may be applied to a second terminal of the precharge transistor PCX. The precharge transistor PCX may serve as a current source in response to the precharge control signal PC. In another implementation (not shown), an additional transistor may be connected in series between the source follower SF and the precharge transistor PCX.

The pixel signal generating circuit 120' may include a first sampling transistor SAMP1, a second sampling transistor SAMP2, a first capacitor C1', a second capacitor C2', a first source follower SF1, a second source follower SF2, a first selection transistor SX1, and a second selection transistor SX2.

The first sampling transistor SAMP1 may be connected between the output node NO and a first node N1, and may be turned on or off in response to the first sampling control signal SAMPS1. The second sampling transistor SAMP2 may be connected between the output node NO and a second node N2, and may be turned on or off in response to the second sampling control signal SAMPS2.

A first terminal of the first capacitor C1' may be connected to the first node N1. A power supply voltage VDD may be applied to a second terminal of the first capacitor C1'. In another implementation, a ground voltage may be applied to the second terminal of the first capacitor C1'. When the first sampling transistor SAMP1 is turned on, charges corresponding to the detection signal DS may be accumulated in the first capacitor C1'. For example, charges caused by a photocharge accumulation operation may be accumulated in the first capacitor C1'.

A first terminal of the second capacitor C2' may be connected to the second node N2. A power supply voltage VDD may be applied to a second terminal of the second capacitor C2'. In another implementation, a ground voltage may be applied to the second terminal of the second capacitor C2'. When the second sampling transistor SAMP2 is turned on, charges caused by a detection signal DS may be accumulated in the second capacitor C2'. For example, charges caused by a reset operation on the floating diffusion node FD may be accumulated in the second capacitor C2'.

The power supply voltage VDD may be applied to a first terminal of the first source follower SF1, and a second terminal of the first source follower SF1 may be connected to the first selection transistor SX1. The first source follower SF1 may buffer a signal corresponding to the amount of charge stored in the first capacitor C1', amplify a potential change at the first node N1, and output the first pixel signal PXS1.

A first terminal of the first selection transistor SX1 may be connected to the first source follower SF1, and a second terminal of the first selection transistor SX1 may be connected to a first column line CL1. In response to the first selection control signal SEL1, the first selection transistor SX1 may output, to the first column line CL1, an image signal SIC caused by a photocharge accumulation operation as a first pixel signal PXS1.

The power supply voltage VDD may be applied to a first terminal of the second source follower SF2, and the second selection transistor SX2 may be connected to a second terminal of the second source follower SF2. The second source follower SF2 may buffer a signal corresponding to the amount of charge stored in the second capacitor C2', amplify a potential change at the second node N2, and output the second pixel signal PXS2.

A first terminal of the second selection transistor SX2 may be connected to the second source follower SF2, and a second terminal of the second selection transistor SX2 may be connected to a second column line CL2. In response to the second selection control signal SEL2, the second selection transistor SX2 may output, to the second column line CL2, a reset signal RST caused by a reset operation as the second pixel signal PXS2.

The first capacitor C1' may be a capacitor having a relatively large capacitance. When the overflow transistor SOF and the first sampling transistor SAMP1 are turned on and the precharge transistor PCX is turned off, the floating diffusion node FD may be connected to the output node NO, and thus, the parasitic capacitor CFD of the floating diffusion node FD may be electrically connected to the first capacitor C1' of the pixel signal generating circuit 120'. Accordingly, when the overflow transistor SOF is turned on, the equivalent capacitance of the floating diffusion node FD may increase, and a relatively large amount of photocharge generated by the photodiode PD may be accumulated in the parasitic capacitor CFD of the floating diffusion node FD and the first capacitor C1'. The FWC of the pixel PX' may be increased.

In an overflow operation mode, by turning on the conversion gain transistor DCGX, the overflow transistor SOF, and the first sampling transistor SAMP1, and turning off the precharge transistor PCX, the image sensor according to the present example embodiment may control the pixels such that photocharges generated and overflowed by the photodiode PD are accumulated in a capacitor CFD of the floating diffusion node FD, a capacitor CDCG of the conversion gain transistor DCGX, and the first capacitor C1' of the pixel signal generating circuit 120'. In another implementation, the conversion gain transistor DCGX may be maintained in an off state in the overflow operation mode.

In an LCG mode, by turning off the overflow transistor SOF and turning on the conversion gain transistor DCGX, the image sensor may control the pixels such that photocharges generated and overflowed by the photodiode PD are accumulated in the capacitor CFD of the floating diffusion node FD and the capacitor CDCG of the conversion gain transistor DCGX.

In an HCG mode, by turning off both the overflow transistor SOF and the conversion gain transistor DCGX, the image sensor may control the pixels such that photocharges generated and overflowed by the photodiode PD are accumulated only in the capacitor CFD of the floating diffusion node FD.

Referring to FIG. 9, the pixel PXa' may include a photodetection circuit 110a' and a pixel signal generating circuit 120' configured to output a first pixel signal PXS1 and a second pixel signal PXS2 in response to a detection signal DS output by the photodetection circuit 110a'. The photodetection circuit 110a' may include a photodiode PD, a transfer transistor TX, a reset transistor RX, a source follower SF, a precharge transistor PCX, an overflow transistor SOFa, and a conversion gain transistor DCGX.

The overflow transistor SOFa may electrically connect the floating diffusion node FD to the reset node NR, or electrically isolate the floating diffusion node FD from the reset node NR, in response to the overflow control signal OFS output by the pixel driver (refer to 200 in FIG. 1).

In an overflow operation mode, the image sensor may turn on the conversion gain transistor DCGX, the overflow transistor SOFa, and the first sampling transistor SAMP1, and turn off the precharge transistor PCX. Thus, the image sensor may control pixels such that photocharges generated and overflowed by the photodiode PD are accumulated in a capacitor CFD of the floating diffusion node FD, a capacitor CDCG of the conversion gain transistor DCGX, and the first capacitor C1' of the pixel signal generating circuit 120'.

In an LCG mode, by turning off the overflow transistor SOFa and turning on the conversion gain transistor DCGX, the image sensor may control the pixels such that photocharges generated and overflowed by the photodiode PD are accumulated in the capacitor CFD of the floating diffusion node FD and the capacitor CDCG of the conversion gain transistor DCGX.

In an HCG mode, by turning off both the overflow transistor SOFa and the conversion gain transistor DCGX, the image sensor may control the pixels such that photocharges generated and overflowed by the photodiode PD are accumulated only in the capacitor CFD of the floating diffusion node FD.

Referring to FIGS. 8 and 9, by turning the overflow transistor SOF or SOFa on or off, the image sensor according to the present example embodiment may increase the equivalent capacitance of the floating diffusion node FD in a high-illuminance environment and reduce the equivalent capacitance of the floating diffusion node FD in a low-illuminance environment. Also, the image sensor according to the present example embodiment may obtain a WDR without increasing the area of the pixel PX. Furthermore, because the pixel PX' further includes the conversion gain transistor DCGX, the image sensor may operate in the overflow operation mode, the LCG mode, and the HCG mode by controlling on/off operations of the overflow transistor SOF or SOFa and the conversion gain transistor DCGX.

Figure 10:
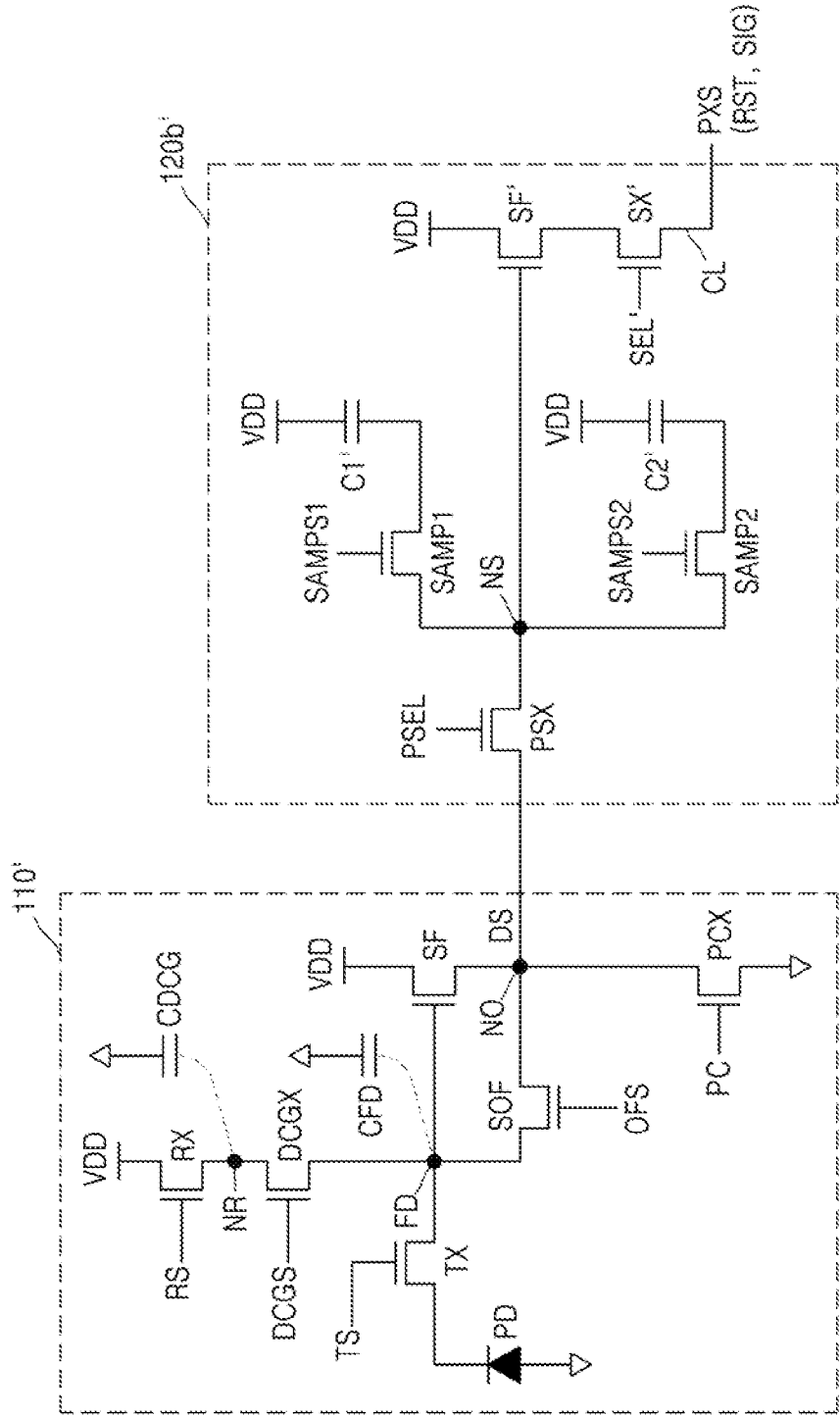
FIGS. 10 and 11 are circuit diagrams of pixels included in image sensors, according to example embodiments.
Figure 11:
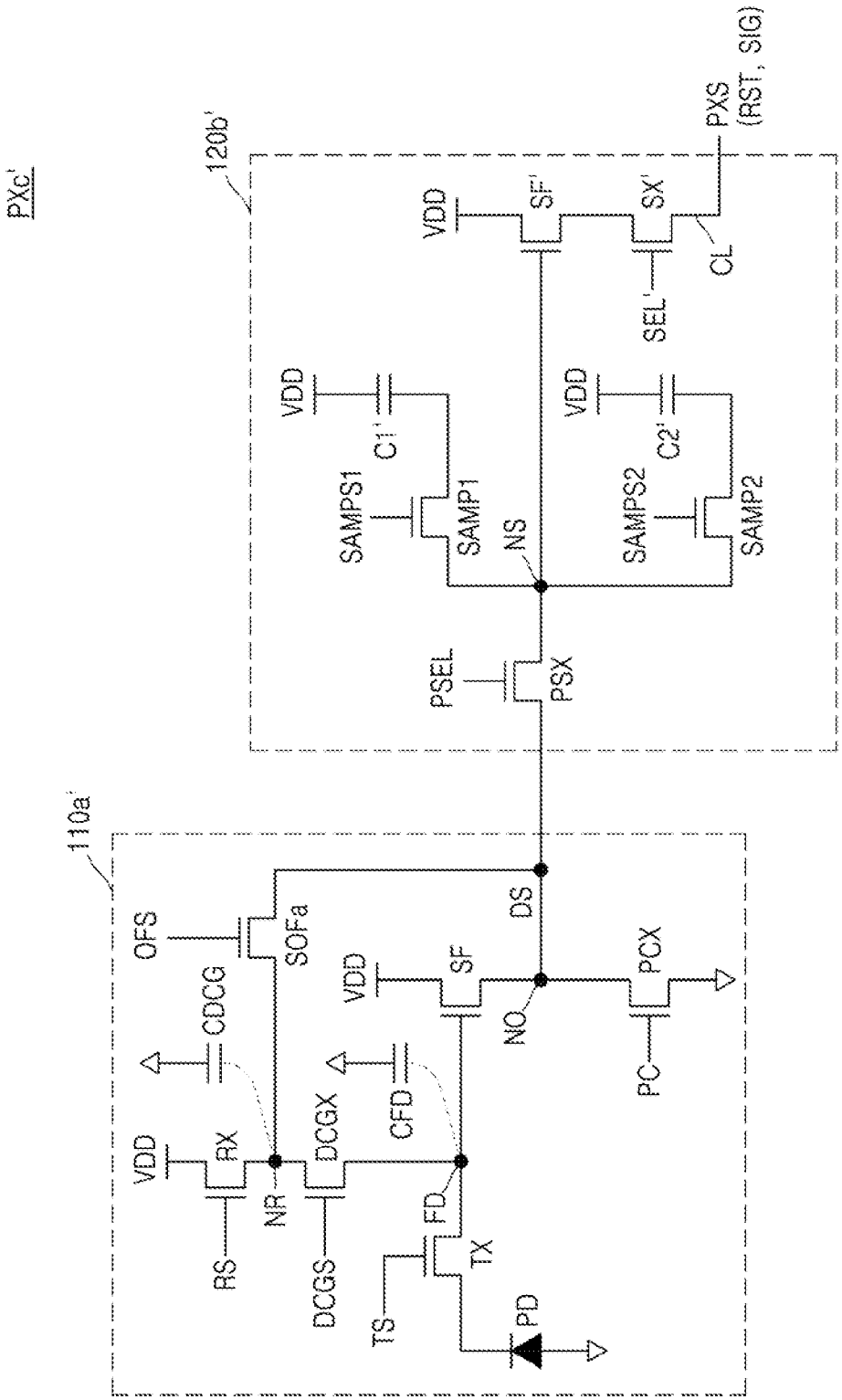

FIGS. 10 and 11 are circuit diagrams of pixels included in image sensors, according to example embodiments.

Pixels PXb' and PXc' respectively shown in FIGS. 10 and 11 may be examples of pixels capable of a global shutter operation. In the image sensor according to the present example embodiment, a circuit configuration of a pixel signal generating circuit 120b' included in each of the pixels PXb' and PXc' may be variously modified.

A reset control signal RS, a conversion gain control signal DCGS, a transfer control signal TS, an overflow control signal OFS, a precharge control signal PC, a precharge selection control signal PSEL, first and second sampling control signals SAMPS1 and SAMPS2, and a selection control signal SEL', which are described with reference to FIGS. 10 and 11, may be included in the control signals CTRL' of FIG. 7. In FIGS. 10 and 11, the same descriptions as those given with reference to FIGS. 8 and 9 may be omitted.

Referring to FIG. 10, the pixel PXb' may include a photodetection circuit 110', and a pixel signal generating circuit 120b' configured to output a pixel signal PXS in response to a detection signal DS output by the photodetection circuit 110'.

The pixel signal generating circuit 120b' may include a precharge selection transistor PSX, a first sampling transistor SAMP1, a second sampling transistor SAMP2, a first capacitor C1', a second capacitor C2', a source follower SF', and a selection transistor SX'.

The precharge selection transistor PSX may be connected between the output node NO of the photodetection circuit 110' and a sensing node NS of the photodetection circuit 110', and may be turned on or off in response to a precharge selection control signal PSEL to reset the sensing node NS.

The first sampling transistor SAMP1 may be connected to the sensing node NS. The first sampling transistor SAMP1 may be turned on or off in response to the first sampling control signal SAMPS1. Thus, charges corresponding to the detection signal DS may be accumulated in the first capacitor C1'. For example, charges caused by a photocharge accumulation operation may be accumulated in the first capacitor C1'.

The second sampling transistor SAMP2 may be connected to the sensing node NS. The second sampling transistor SAMP2 may be turned on or off in response to the second sampling control signal SAMPS2. Thus, charges corresponding to the detection signal DS may be accumulated in the second capacitor C2'. For example, charges caused by a photocharge accumulation operation may be accumulated in the second capacitor C2'. For example, charges caused by a reset operation on the floating diffusion node FD may be accumulated in the second capacitor C2'.

The source follower SF' may amplify a change of an electric potential at the sensing node NS and output the pixel signal PXS, and the selection transistor SX' may output the pixel signal PXS to a column line CL in response to the selection control signal SEL'. The pixel signal PXS may include an image signal SIG caused by the photocharge accumulation operation and a reset signal RST caused by the reset operation on the floating diffusion node FD.

In an overflow operation mode, the image sensor according to the present example embodiment may turn on a conversion gain transistor DCGX, an overflow transistor SOF, the precharge selection transistor PSEL, and the first sampling transistor SAMP1, and turn off the precharge transistor PCX. Thus, the image sensor may control pixels such that photocharges generated and overflowed by the photodiode PD are accumulated in a capacitor CFD of the floating diffusion node FD, a capacitor CDCG of the conversion gain transistor DCGX, and the first capacitor C1' of the pixel signal generating circuit 120b'. In another implementation, the conversion gain transistor DCGX may be maintained in an off state in the overflow operation mode.

In an LCG mode, by turning off the overflow transistor SOF and turning on the conversion gain transistor DCGX, the image sensor may control the pixels such that photocharges generated and overflowed by the photodiode PD are accumulated in the capacitor CFD of the floating diffusion node FD and the capacitor CDCG of the conversion gain transistor DCGX.

In an HCG mode, by turning off both the overflow transistor SOF and the conversion gain transistor DCGX, the image sensor may control the pixels such that photocharges generated and overflowed by the photodiode PD are accumulated only in the capacitor CFD of the floating diffusion node FD.

Referring to FIGS. 10 and 11, the pixel PXc' may include a photodetection circuit 110a' and the pixel signal generating circuit 120b' configured to output a pixel signal PXS in response to a detection signal output by the photodetection circuit 110a'. By turning on and off the overflow transistor SOF or SOFa, the image sensor according to the present example embodiment may increase the equivalent capacitance of the floating diffusion node in a high-illuminance environment, reduce the equivalent capacitance of the floating diffusion node FD in a low-illuminance environment, and obtain an HDR without increasing the areas of the pixel PX. Furthermore, because the pixel PX' further includes the conversion gain transistor DCGX, the image sensor may operate in the overflow operation mode, the LCG mode, and the HCG mode by controlling on/off operations of the overflow transistor SOF or SOFa and the conversion gain transistor DCGX.

Figure 12:
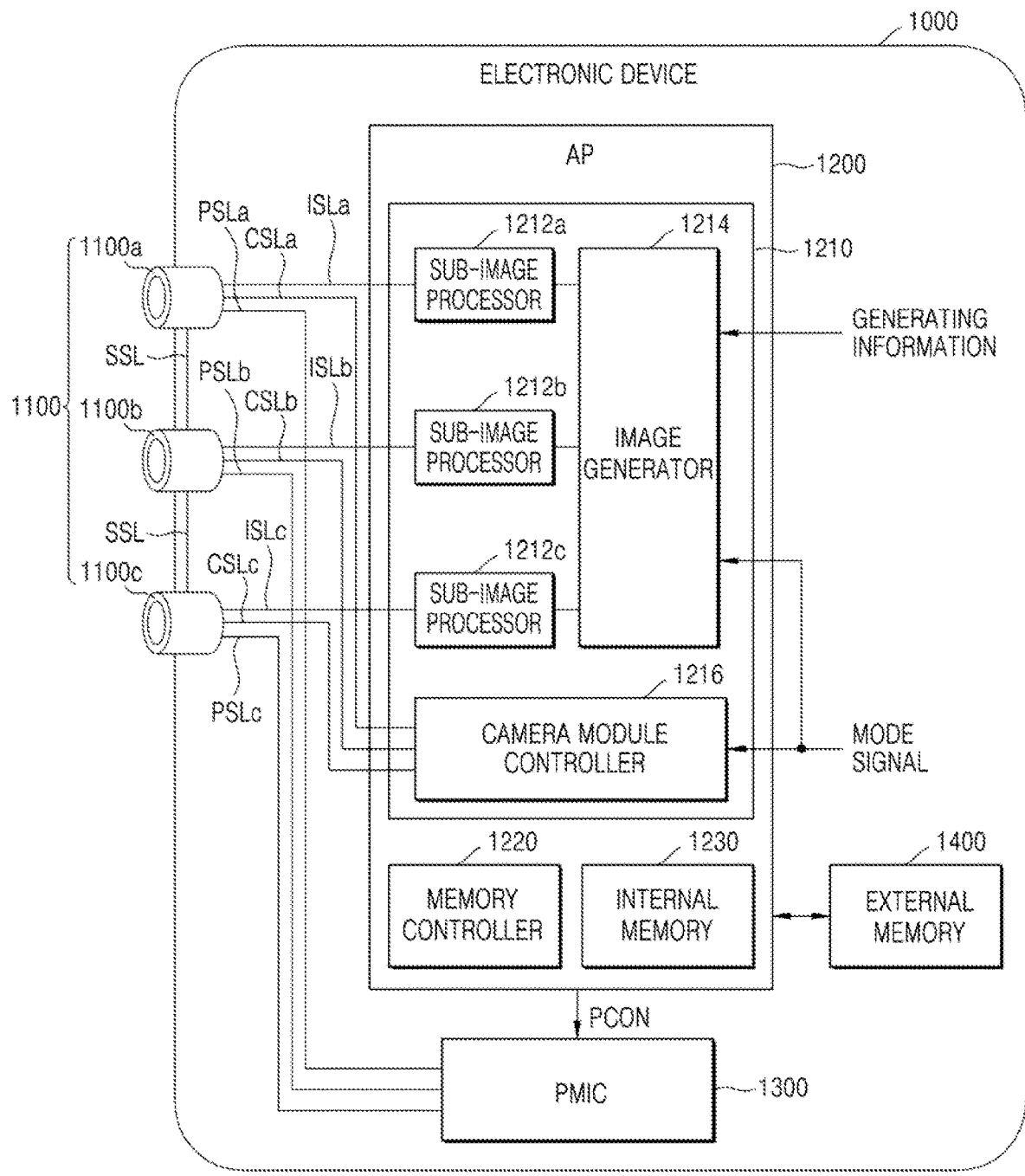
FIG. 12 is a block diagram of an electronic device including a multi-camera module, according to an example embodiment.
Figure 13:
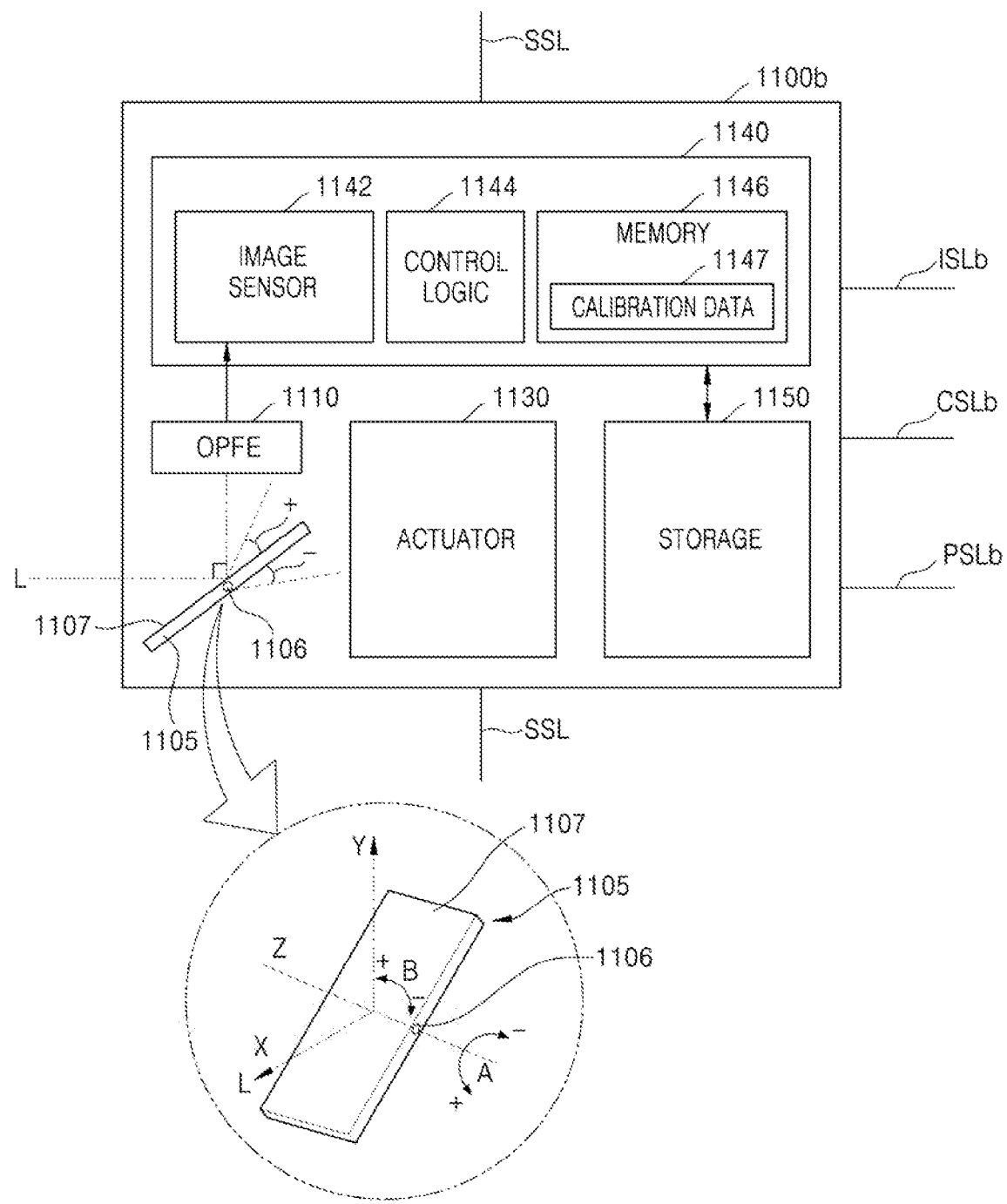
FIG. 13 is a detailed block diagram of the camera module of FIG. 12.

FIG. 12 is a block diagram of an electronic device 1000 including a multi-camera module, according to an example embodiment. FIG. 13 is a detailed block diagram of a camera module 1100b of FIG. 12, according to an example embodiment.

Although a detailed configuration of the camera module 1100b is shown in FIG. 13, the following description may be equally applied to other camera modules 1100a and 1100c according to an example embodiment.

Referring to FIG. 12, the electronic device 1000 may include a camera module group 1100, an AP 1200, a power management integrated circuit (PMIC) 1300, and an external memory 1400.

The camera module group 1100 may include a plurality of camera modules (e.g., 1100a, 1100b, and 1100c). Although FIGS. 12 and 13 illustrate an example embodiment in which three camera modules 1100a, 1100b, and 1100c are arranged, embodiments are not limited thereto.

Referring to FIGS. 12 and 13, the camera module 1100b may include a prism 1105, an optical path folding element (hereinafter, "OPFE") 1110, an actuator 1130, an image sensing device 1140, and a storage 1150.

The prism 1105 may include a reflective surface 1107 having a light reflective material and modify a path of light L incident from the outside.

The OPFE 1110 may include, for example, m (here, m is a natural number) groups of optical lenses.

The actuator 1130 may move the OPFE 1110 or the optical lens (hereinafter, referred to as an optical lens) to a specific position.

The image sensing device 1140 may include an image sensor 1142, a control logic 1144, and a memory 1146.

The image sensor 1142 may sense an image of a sensing target using light L provided through the optical lens. The image sensor 1142 may be the image sensor 10 described with reference to FIG. 1 or the image sensor 10' described with reference to FIG. 7.

The control logic 1144 may control all operations of the camera module 1100b. For example, the control logic 1144 may control an operation of the camera module 1100b in response to a control signal provided through a control signal line CSLb.

In an example embodiment, from among the camera modules 1100a, 1100b, and 1100c, one camera module (e.g., 1100b) may be a camera module of a folded lens type, which includes the prism 1105 and the OPFE 1110 that are described above, and the remaining camera modules (e.g., 1100a and 1100b) may be vertical camera modules, which do not include the prism 1105 and the OPFE 1110.

In an example embodiment, one camera module (e.g., 1100c), from among the camera modules 1100a, 1100b, and 1100c, may be a depth camera of a vertical type, which may extract depth information using infrared (IR) light. In this case, the AP 1200 may merge an image data value provided by the depth camera with an image data value provided from another camera module (e.g., 1100a or 1100b) and generate a three-dimensional (3D) depth image.

In an example embodiment, from among the camera modules 1100a, 1100b, and 1100c, at least two camera modules (e.g., 1100a and 1100b) may have different fields of view. In this case, for example, optical lenses of at least two camera modules (e.g., 1100a and 1100b), from among the camera modules 1100a, 1100b, and 1100c), may be different from each other.

In an example embodiment, respective fields of view of the camera modules 1100a, 1100b, and 1100c may be different from each other. In this case, respective optical lenses included in the camera modules 1100a, 1100b, and 1100c may also be different from each other.

In an example embodiment, the camera modules 1100a, 1100b, and 1100c may be physically separated from each other. Thus, a sensing region of one image sensor 1142 may not be divided and used by the camera modules 1100a, 1100b, and 1100c, but an independent image sensor 1142 may be in each of the camera modules 1100a, 1100b, and 1100c.

Referring back to FIG. 12, the AP 1200 may include an image processing device 1210, a memory controller 1220, and an internal memory 1230. The AP 1200 may be implemented as being separated from the camera modules 1100a, 1100b, and 1100c. For example, the AP 1200 and the camera modules 1100a, 1100b, and 1100c may be separated from each other and implemented as separate semiconductor chips.

The image processing device 1210 may include a plurality of sub-image processors (e.g., 1212a, 1212b, and 1212c), an image generator 1214, and a camera module controller 1216.

The image processing device 1210 may include sub-image processors (e.g., 1212a, 1212b, and 1212c) in equal number to the number of camera modules (e.g., 1100a, 1100b, and 1100c).

Image data values respectively generated by the camera modules 1100a, 1100b, and 1100c may be provided to the corresponding ones of the sub-image processors 1212a, 1212b, and 1212c through the image signal lines ISLa, ISLb, and ISLc, which are separated from each other. For example, the image data value generated by the camera module 1100a may be provided through the image signal line ISLa to the sub-image processor 1212a, the image data value generated by the camera module 1100b may be provided through the image signal line ISLb to the sub-image processor 1212b, and the image data value generated by the camera module 1100c may be provided through the image signal line ISLc to the sub-image processor 1212c. The transmission of the image data values may be performed, for example, using a camera serial interface (CSI) based on a mobile industry processor interface (MIPI).

The image data values respectively provided to the sub-image processors 1212a, 1212b, and 1212c may be provided to the image generator 1214. The image generator 1214 may generate an output signal using image data provided by each of the sub-image processors 1212a, 1212b, and 1212c based on image generating information or a mode signal.

For example, the image generator 1214 may generate an output image by merging at least some of the image data values generated by the camera modules 1100a, 1100b, and 1100c having different fields of view, based on the image generating information or the mode signal. Furthermore, the image generator 1214 may generate an output image by selecting any one of the image data values generated by the camera modules 1100a, 1100b, and 1100c having different fields of view, based on the image generating information or the mode signal.

The camera module controller 1216 may provide a control signal to each of the camera modules 1100a, 1100b, and 1100c. The control signal generated by the camera module controller 1216 may be provided to the corresponding one of the camera modules 1100a, 1100b, and 1100c through control signal lines CSLa, CSLb, and CSLc, which are separated from each other.

The AP 1200 may store the received image data values (i.e., encoded data) in the internal memory 1230 or the external memory 1400 provided outside the AP 1200, then read and decode the encoded data from the internal memory 1230 or the external memory 1400, and display an image, which is generated based on the decoded image data value. For example, the sub-image processors 1212a, 1212b and 1212c corresponding to each camera modules 1100a, 1100b, and 1100c of the image processing device 1210 may perform a decoding operation and perform an image processing operation on the decoded image data value.

The PMIC 1300 may supply power (e.g., a power supply voltage) to each of the camera modules 1100a, 1100b, and 1100c. For example, via the control of the AP 1200, the PMIC 1300 may supply first power to the camera module 1100a through a power signal line PSLa, supply second power to the camera module 1100b through a power signal line PSLb, and supply third power to the camera module 1100c through a power signal line PSLc.

By way of summation and review, a resolution of an image sensor may be increased by arranging a relatively large number of pixels therein. As the size of each of the pixels is gradually reduced, a pixel structure for efficiently increasing the capacitance of a floating diffusion node may be desirable.

As described above, embodiments may provide an image sensor including a pixel, which may increase a capacitance of a floating diffusion node using an internal capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor comprising a plurality of pixels, each of the plurality of pixels including:
    a photodetection circuit configured to generate a detection signal; and
    an analog-to-digital converter configured to convert the detection signal using a ramp signal, the analog-to-digital converter including a first internal capacitor,
    wherein the photodetection circuit includes:
        a photodiode;
        a floating diffusion node configured to accumulate photocharges generated by the photodiode, the floating diffusion node including a parasitic capacitor; and an overflow transistor having a first terminal coupled to the floating diffusion node and a second terminal coupled to the first internal capacitor,
wherein in accordance with a control signal provided to the overflow transistor, the floating diffusion node is electrically connected to the first internal capacitor.

2. The image sensor as claimed in claim 1, wherein:
the photodetection circuit further includes a source follower configured to amplify a voltage change of the floating diffusion node, and to output the amplified voltage change to an output node, and
the overflow transistor is connected between the floating diffusion node and the output node.

3. The image sensor as claimed in claim 2, wherein:
the photodetection circuit further includes:
a reset transistor configured to reset the floating diffusion node to a power supply voltage; and
a conversion gain transistor connected between a reset node and the floating diffusion node, and
the reset node is connected to one terminal of the reset transistor.

4. The image sensor as claimed in claim 1, wherein:
the photodetection circuit includes:
a source follower configured to amplify a voltage change of the floating diffusion node, and to output the amplified voltage change to an output node;
a reset transistor configured to reset the floating diffusion node to a power supply voltage; and
a conversion gain transistor connected between a reset node and the floating diffusion node,
the reset node is connected to one terminal of the reset transistor.

5. The image sensor as claimed in claim 1, wherein the analog-to-digital converter includes:
a second internal capacitor to which the ramp signal is applied; and
a comparator configured to compare the detection signal received through the first internal capacitor with the ramp signal received through the second internal capacitor, and to output a comparison result signal.

6. The image sensor as claimed in claim 1, wherein, in a period in which the overflow transistor is turned on, the ramp signal is generated to increase at a constant slope.

7. The image sensor as claimed in claim 1, wherein:
the photodetection circuit further includes a selection transistor connected to an output node from which the detection signal is output, and
the selection transistor is turned off in a period in which the overflow transistor is turned on.

8. An image sensor configured to operate in each of a plurality of modes according to illuminance, the image sensor comprising:
a pixel array including a plurality of pixels, each pixel including a photodetection circuit and an analog-to-digital converter configured to convert a detection signal detected by the photodetection circuit, the photodetection circuit including an overflow transistor; and
a pixel driver configured to provide an overflow control signal to the overflow transistor, wherein:
the analog-to-digital converter includes an internal capacitor,
photocharges generated by the photodetection circuit are stored in the internal capacitor in response to the overflow control signal,
the overflow transistor includes a first terminal coupled to a floating diffusion node of the photodetection circuit and a second terminal coupled to the internal capacitor, and
in accordance with the overflow control signal, the floating diffusion node is electrically connected to the internal capacitor.

9. The image sensor as claimed in claim 8, wherein:
the plurality of modes includes an overflow operation mode, and
when the image sensor operates in the overflow operation mode, the pixel driver generates the overflow control signal such that the photocharges generated by the photodetection circuit are stored in the internal capacitor.

10. The image sensor as claimed in claim 8, wherein:
the plurality of modes includes a high conversion gain (HCG) mode, and
when the image sensor operates in the HCG mode, the pixel driver generates the overflow control signal such that a floating diffusion node of the photodetection circuit, in which the photocharges are accumulated, is electrically isolated from the internal capacitor.

11. The image sensor as claimed in claim 8, wherein the photocharges are accumulated in the floating diffusion node.

12. The image sensor as claimed in claim 8,
wherein the photocharges are accumulated in a parasitic capacitance of the floating diffusion node, and
wherein the photodetection circuit further includes:
a reset transistor configured to reset the floating diffusion node to a power supply voltage; and
a conversion gain transistor connected between a reset node and the floating diffusion node, wherein the reset node is connected to one terminal of the reset transistor.

13. The image sensor as claimed in claim 8, wherein:
the analog-to-digital converter is configured to convert the detection signal into a digital signal using a ramp signal, and
the analog-to-digital converter is configured to convert the detection signal corresponding to a state in which the photodetection circuit is reset, after converting the detection signal corresponding to the photocharges stored in the internal capacitor.

14. An image sensor comprising a plurality of pixels, each of the plurality of pixels including:
a photodetection circuit configured to generate a detection signal; and
a pixel signal generating circuit including at least one capacitor configured to store charges corresponding to the detection signal, the pixel signal generating circuit being configured to generate a pixel signal corresponding to the detection signal,
wherein the photodetection circuit includes:
a photodiode;
a floating diffusion node configured to accumulate photocharges generated by the photodiode;
an overflow transistor having a first terminal coupled to the floating diffusion node and a second terminal coupled to the at least one capacitor, wherein in accordance with a control signal provided to the overflow transistor, the floating diffusion node is electrically connected to the at least one capacitor; and
a source follower configured to amplify a voltage change of the floating diffusion node, and to output the amplified voltage change to an output node, wherein the overflow transistor is connected between the floating diffusion node and the output node.

15. The image sensor as claimed in claim 14, wherein:
the photodetection circuit includes:
- a reset transistor configured to reset the floating diffusion node to a power supply voltage; and
- a conversion gain transistor connected between a reset node and the floating diffusion node.

16. The image sensor as claimed in claim 15, wherein the reset node is connected to one terminal of the reset transistor.

17. The image sensor as claimed in claim 14, wherein:
the pixel signal generating circuit includes:
- a first capacitor configured to store charges corresponding to a voltage of the floating diffusion node in which the photocharges are accumulated; and
- a second capacitor configured to store charges corresponding to a voltage of the floating diffusion node, which is reset, and in accordance with the control signal, the overflow transistor electrically connects the floating diffusion node to the first capacitor.

18. The image sensor as claimed in claim 17, wherein:
the image sensor is configured to operate in each of a plurality of operation modes according to illuminance, and
photocharges generated by the photodetection circuit are stored in the floating diffusion node and the first capacitor in a first mode included in the plurality of operation modes.

* * * * *